(12) United States Patent
Tomita et al.

(10) Patent No.: US 9,065,064 B2
(45) Date of Patent: Jun. 23, 2015

(54) MANUFACTURING METHOD AND MANUFACTURING APPARATUS OF FUNCTIONAL ELEMENT

(71) Applicant: Kabushiki Kaisha Toshiba, Tokyo (JP)

(72) Inventors: Hiroshi Tomita, Kanagawa (JP); Hisashi Okuchi, Mie (JP); Yasuhito Yoshimizu, Mie (JP); Yusuke Tanaka, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 31 days.

(21) Appl. No.: 13/787,703

(22) Filed: Mar. 6, 2013

(65) Prior Publication Data

US 2014/0065765 A1 Mar. 6, 2014

(30) Foreign Application Priority Data

Aug. 28, 2012 (JP) .................. 2012-187623

(51) Int. Cl.
| | | |
|---|---|---|
| *H01L 51/00* | (2006.01) | |
| *H01L 51/05* | (2006.01) | |
| *H01L 51/56* | (2006.01) | |
| *B82Y 10/00* | (2011.01) | |
| *H01L 21/02* | (2006.01) | |
| *G11C 13/00* | (2006.01) | |

(52) U.S. Cl.
CPC ........ *H01L 51/0098* (2013.01); *H01L 51/0007* (2013.01); *H01L 21/02301* (2013.01); *H01L 21/02115* (2013.01); *H01L 21/02057* (2013.01); *H01L 51/0017* (2013.01); *H01L 51/0029* (2013.01); *H01L 51/0591* (2013.01); *H01L 51/56* (2013.01); *G11C 13/0016* (2013.01); *B82Y 10/00* (2013.01)

(58) Field of Classification Search
CPC ................ H01L 21/02225; H01L 21/0226; H01L 21/02301
See application file for complete search history.

(56) References Cited

U.S. PATENT DOCUMENTS

| | | | |
|---|---|---|---|
| 6,550,988 B2 | 4/2003 | Sugimoto et al. | |
| 6,852,586 B1 | 2/2005 | Buynoski et al. | |
| 2004/0165806 A1 | 8/2004 | Zhou et al. | |
| 2006/0068678 A1* | 3/2006 | Ogawa | ............................ 445/24 |
| 2012/0232741 A1 | 9/2012 | Sekiyama et al. | |

FOREIGN PATENT DOCUMENTS

| | | |
|---|---|---|
| JP | 2002353379 A | 12/2002 |
| JP | 2007-527620 | 9/2007 |
| JP | 2009260035 A | 11/2009 |
| JP | 2011018542 A | 1/2011 |

* cited by examiner

*Primary Examiner* — Cheung Lee
(74) *Attorney, Agent, or Firm* — Patterson & Sheridan LLP

(57) ABSTRACT

According to one embodiment, the manufacturing method of a functional element includes filling a solvent comprising hydrogen gas and having organic molecules dispersed therein into a gap between the first electrode and the second electrode formed facing the first electrode, and forming an organic layer containing the organic molecules mentioned above between the first electrode and the second electrode.

15 Claims, 13 Drawing Sheets

Fig. 1A
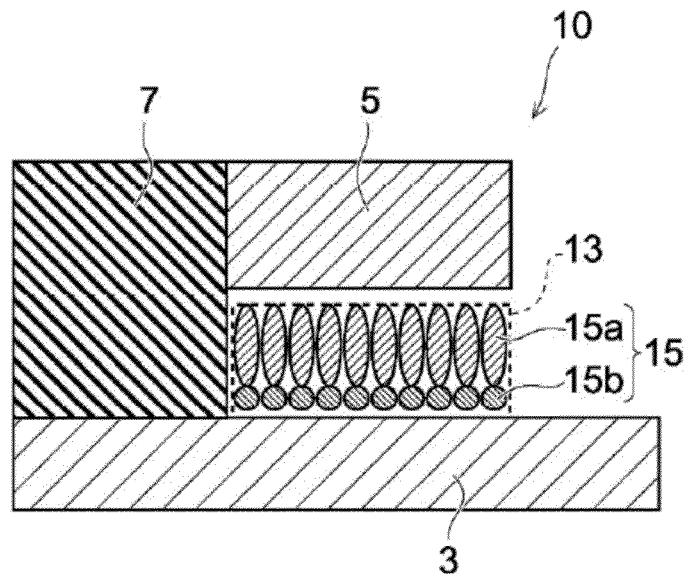
Fig. 1B
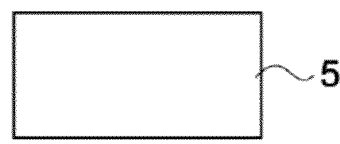
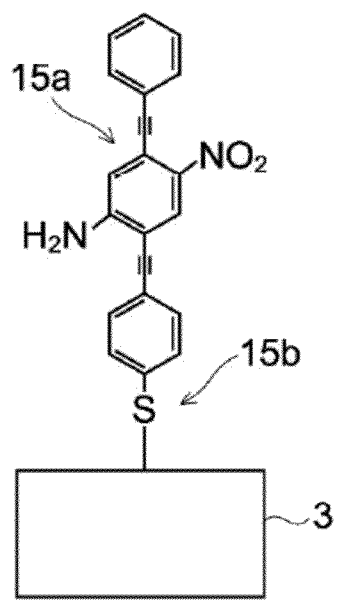

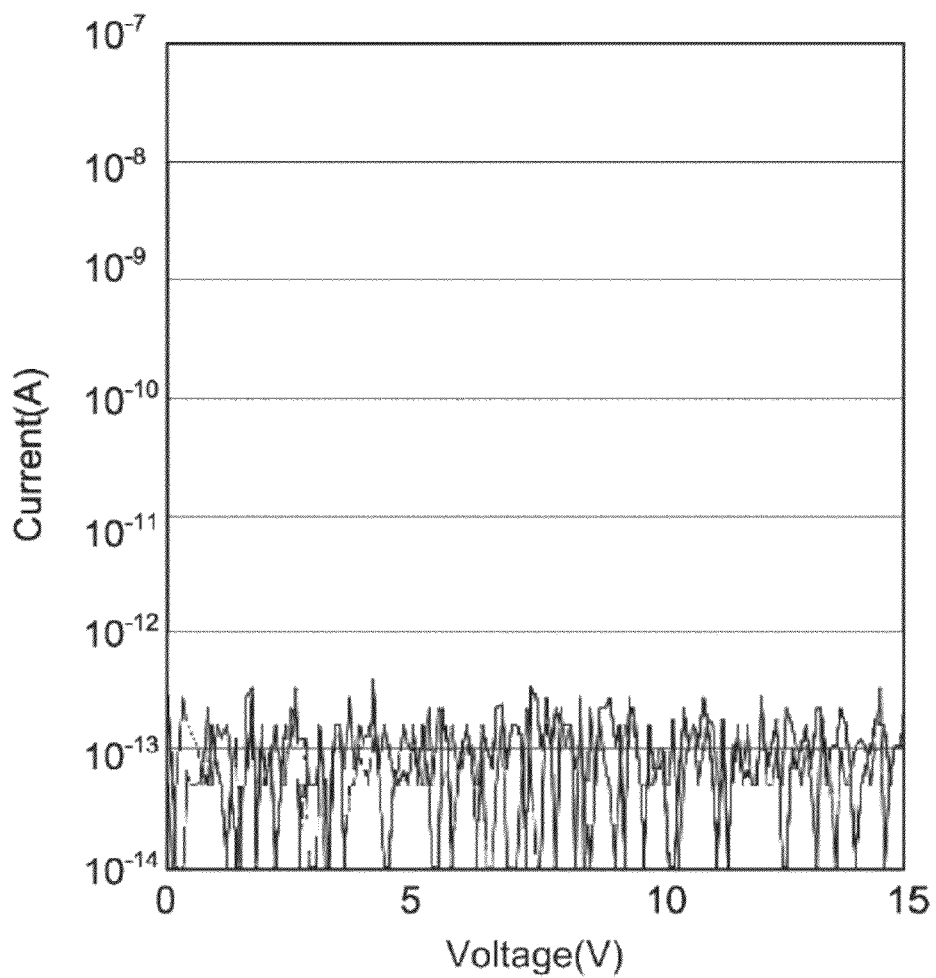

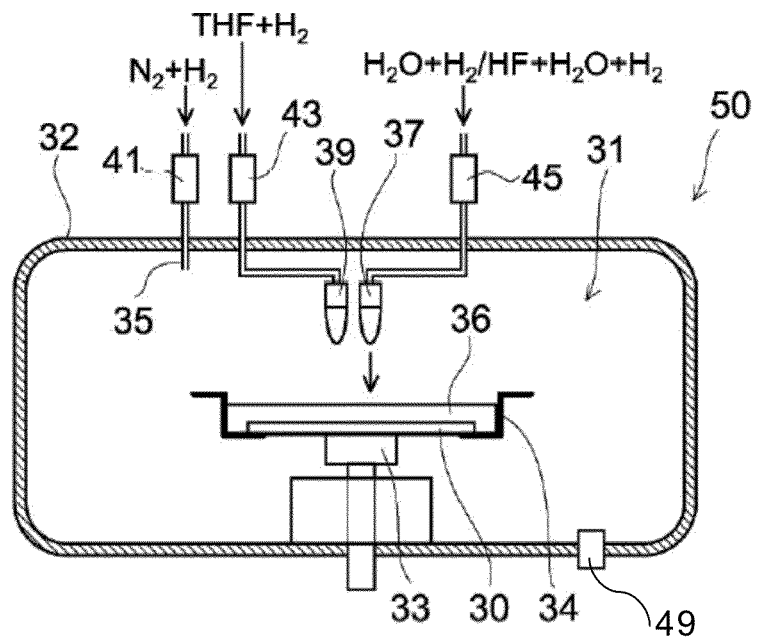
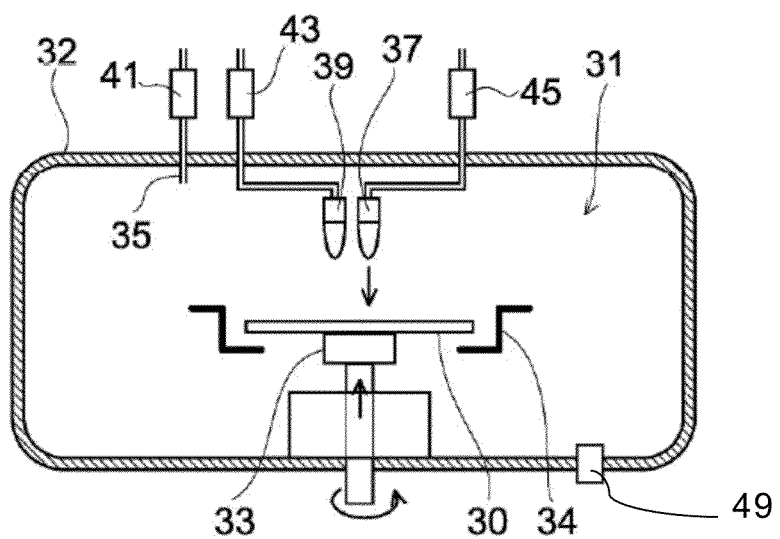

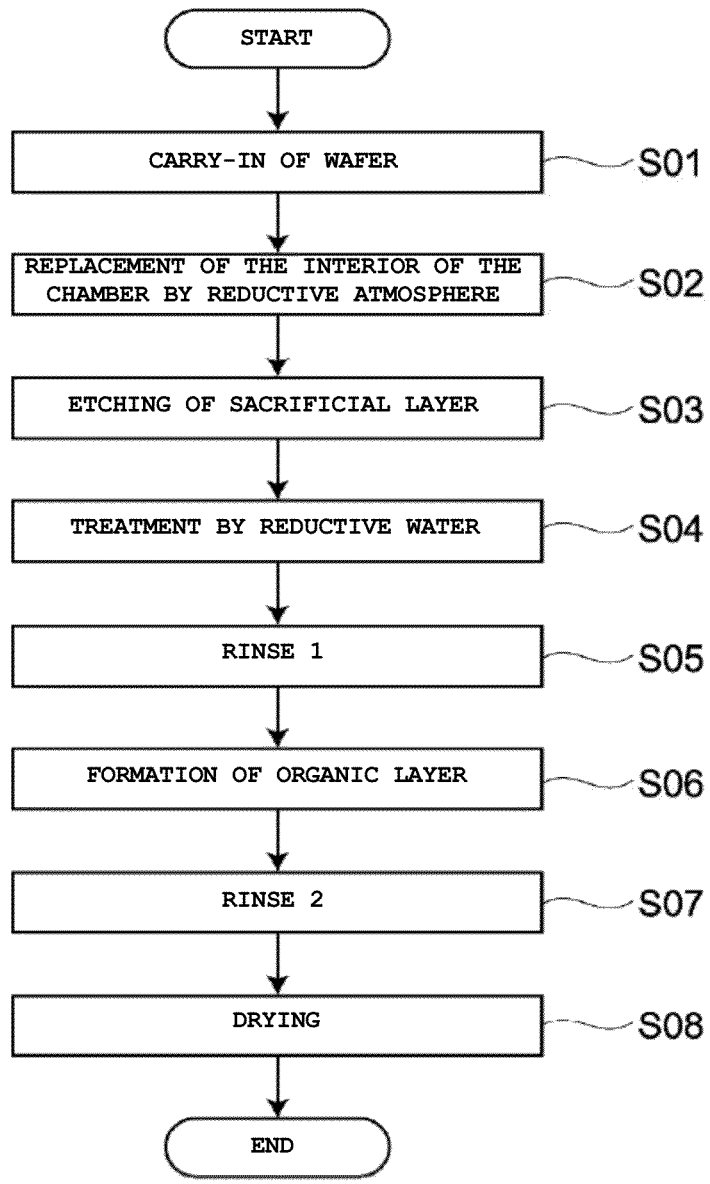

MANUFACTURING METHOD AND MANUFACTURING APPARATUS OF FUNCTIONAL ELEMENT

CROSS-REFERENCE TO RELATED APPLICATION

This application is based upon and claims the benefit of priority from Japanese Patent Application No. 2012-187623, filed on Aug. 28, 2012; the entire contents of which are incorporated herein by reference.

FIELD

Embodiments described herein relates to a manufacturing method and a manufacturing apparatus of a functional element.

BACKGROUND

In recent years, with progress in miniaturization and lower power consumption of semiconductor devices, these semiconductor devices have started to show some limitations. Studies are being carried out on organic material devices as a functional element with higher density and lower power consumption. For example, by forming a self-assembled monolayer (SAM) between metal portions facing each other via a so-called nano-gap, a gap of 5 nm or smaller, it is possible to exploit the SAM-intrinsic electroconductivity characteristics. However, it is not an easy task to form the SAM uniformly in the fine nano-gap.

DESCRIPTION OF THE DRAWINGS

FIGS. 1A and 1B are schematic diagrams illustrating a functional element according to a first embodiment.

FIG. 4 is a graph illustrating the current-voltage characteristics of the gap between metals according to the first embodiment.

FIGS. 6A and 6B are schematic diagrams illustrating a functional element device according to the first embodiment.

FIG. 8 is a flow chart illustrating the sequence of the manufacturing steps for the functional element device of the first embodiment.

DETAILED DESCRIPTION

Figure 2A:
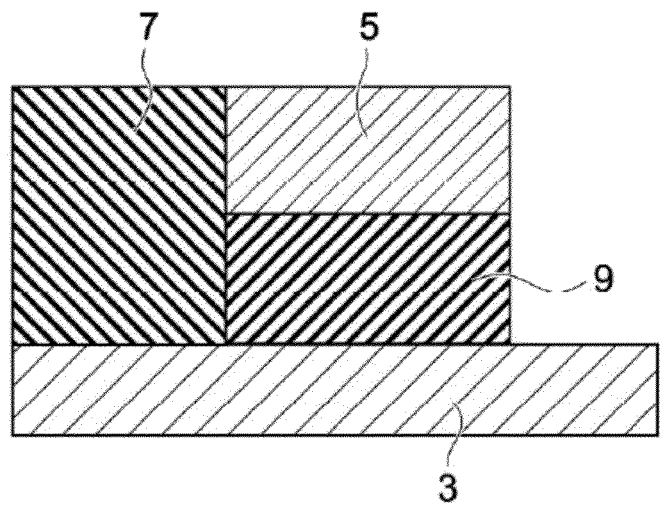
FIGS. 2A to 2C are schematic cross-sectional views illustrating the manufacturing process of the functional element according to the first embodiment.

The embodiments of the disclosure provides a manufacturing method of a functional element having a uniform organic layer formed on the surface of metal electrodes that face each other via a nano-gap.

In general, according to the embodiments, the present disclosure will be explained with reference to the drawings. The same keys are adopted throughout the drawings, so they will not be explained repeatedly. Only the different parts will be explained.

According to the manufacturing method of the functional element according to one embodiment, a portion between a first electrode and a second electrode formed facing the first electrode is filled with a solvent doped with hydrogen gas and having organic molecules dispersed therein to form an organic layer containing the organic molecules between the first electrode and the second electrode.

First Embodiment

FIG. 1 is a schematic diagram illustrating a functional element 10 according to the first embodiment. The functional element 10 may be, for example, a molecular memory cell having a lower electrode 3 as the first electrode, an upper electrode 5 as the second electrode, and an organic layer 13.

As shown in FIG. 1A, the upper electrode 5 is supported by an insulating layer 7 arranged on the lower electrode 3. The upper electrode 5 faces the lower electrode 3 via a gap of, for example, 5 to 10 nm. For example, the lower electrode 3 contains tungsten (W). The upper electrode 5 contains molybdenum (Mo). Then, the organic layer 13 is arranged between the lower electrode 3 and the upper electrode 5. The organic layer 13 is a self-assembled mono-molecular film (SAM) containing organic molecules 15.

As shown in FIG. 1B, the organic molecules 15 have a resistance-varying type molecular chain 15a (variable resistance region), with a reaction group 15b (reaction region) at one end of the molecular chain 15a. For example, suppose the reaction group 15b is a thiol group, it is bonded with the tungsten atom, yet it is not bonded with the molybdenum atom. Consequently, the organic molecules 15 are connected to the lower electrode 3, while they are not connected to the upper electrode 5. As a result, the organic molecules 15 are aligned to form the SAM on the surface of the lower electrode 3.

For the resistance-varying type molecular chain 15a, when a voltage is applied to its two ends, the low-resistance state and the high-resistance state are switched to each other. As a result, the functional element 10 works as a memory cell that records information corresponding to the resistance value between the upper electrode 5 and the lower electrode 3.

In the following, the manufacturing method of the functional element 10 will be explained with reference to FIGS. 2A-2C. Here, FIG. 2A to FIG. 2C are schematic cross-sectional views illustrating the manufacturing process of the functional element 10.

First of all, as shown in FIG. 2A, the upper electrode 5 is formed via a sacrificial layer 9 on the lower electrode 3. For example, the sacrificial layer 9 may be a silicon oxide film formed using the ALD (Atomic Layer Deposition) method. The ALD method can be adopted for controlling the thickness on the atomic level. For example, it is possible to form the sacrificial layer 9 with a uniform thickness of, for example, a few nm to 10 nm.

Then, the upper electrode 5 and the sacrificial layer 9 are patterned to a prescribed shape, and an insulating layer 7 is formed in contact with the one side surface of the upper electrode 5 and the sacrificial layer 9.

Figure 2B:
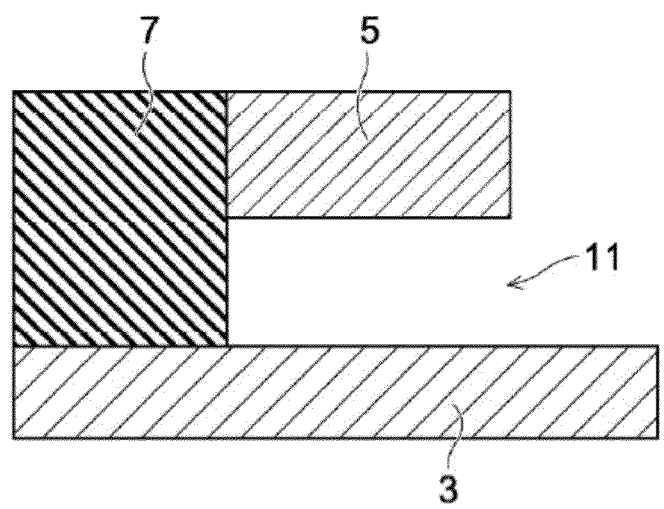
Figure 2C:
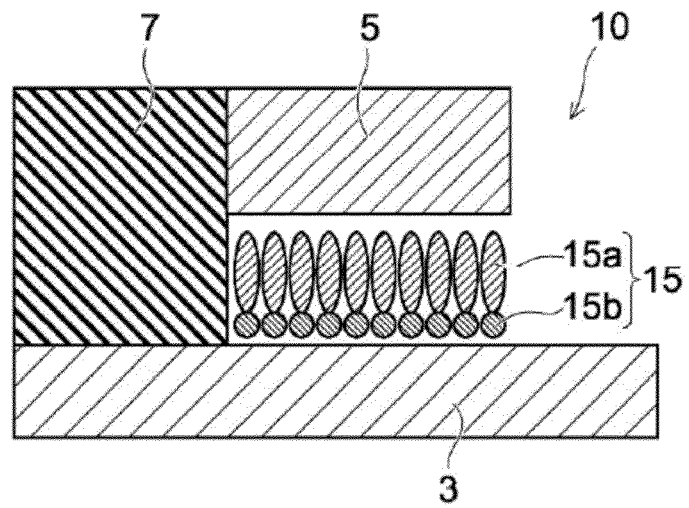

Then, as shown in FIG. 2B, the sacrificial layer 9 formed between the upper electrode 5 and the lower electrode 3 is removed by an etching liquid doped with hydrogen gas. For example, hydrogen gas may be doped in the liquid by bubbling hydrogen gas in the etching liquid prepared by diluting a hydrofluoric acid. As a result, by dipping the lower electrode 3, the sacrificial layer 9 and the upper electrode 5 in the etching liquid, the portion between the lower electrode 3 and the upper electrode 5 is filled with the etching liquid, and the sacrificial layer 9 is etched. The concentration of the hydrofluoric acid should be 0.5% or lower, such as 0.1% or lower, and the etching quantity is controlled. Also, the etching liquid may be sprayed, and the portion between the lower electrode 3 and the upper electrode 5 is filled with the etching liquid.

As a result, it is possible to form the gap 11 corresponding to the thickness of the sacrificial layer 9 between the lower electrode 3 and the upper electrode 5. That is, the upper electrode 5 is supported by the insulating layer 7, and it faces the lower electrode 3 via the gap 11.

Then, a structural body containing the lower electrode 3, the upper electrode 5 and the insulating layer 7 is rinsed by water doped with hydrogen gas to rinse off the etching liquid used to remove the sacrificial layer 9. As a result, the interior of the gap 11 is also rinsed. Doping of the hydrogen gas in the water may be carried out by, for example, bubbling.

Then, the lower electrode 3 and the upper electrode 5 are dipped in a solvent doped with hydrogen gas and having organic molecules 15 dispersed therein to form an organic layer 13 containing the organic molecules 15 (FIGS. 1A and 1B) between the lower electrode 3 and the upper electrode 5. The organic molecules 15 contain a resistance-varying type molecular chain 15$a$ and reaction group 15$b$. As explained above, if the reaction group 15$b$ is a thiol group, the organic molecules 15 are bonded via the reaction group 15$b$ to the lower electrode 3, forming a monolayer of molecules aligned with the same orientation.

Figure 3:
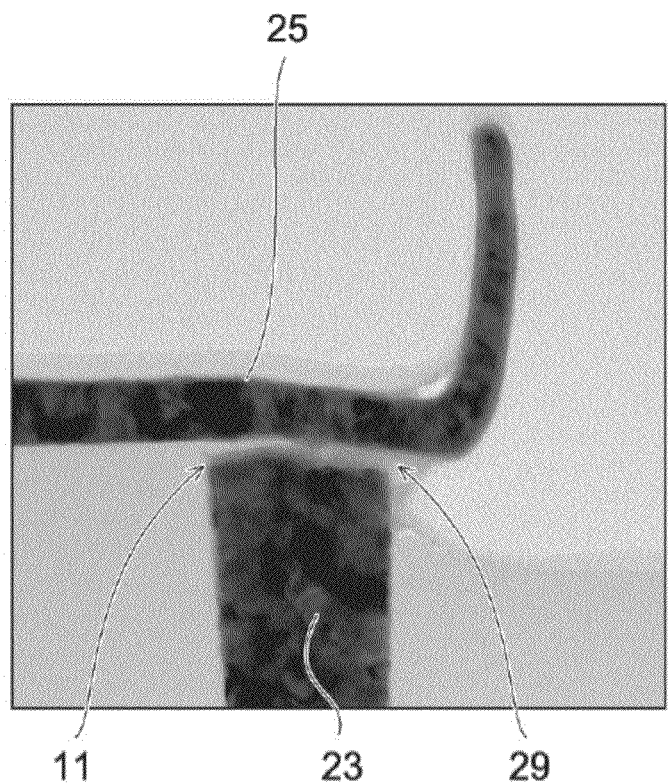
FIG. 3 shows the Transmission Electron Microscope image (TEM image) of the gap between metals according to a conventional example.

FIG. 3 shows a (TEM) image of the gap between metals according to a conventional example. In this example, after the sacrificial oxide film arranged between a lower electrode 23 and an upper electrode 25 is etched by the diluted solution of hydrogen fluoride, followed by rinsing by water not doped with hydrogen gas.

FIG. 3 shows the TEM image of the metal gap after water rinsing. It shows the gap 11 between the lower electrode 23 and the upper electrode 25. As shown in the drawing, the substance included inside the gap 11 can be confirmed. By the oxygen contained in the etching liquid for etching the sacrificial oxide film or the rinsing liquid after etching, the metal elements in the lower electrode 23 and/or the upper electrode 25 are oxidized. For example, if the lower electrode 23 and the upper electrode 25 are made of different substances, galvanic corrosion makes progress due to the difference in the chemical potential between them.

In this way, when the gap 11 is clogged by a metal oxide 29, it is difficult to feed the organic molecules 15 into the gap 11, and it is impossible to form the organic layer 13. Here, a method for forming the gap 11 that can suppress oxidation of the lower electrode 23 and the upper electrode 25 is adopted according to embodiments described herein.

According to one embodiment, etching of the sacrificial layer 9 is carried out by using a diluted solution of hydrogen fluoride doped with hydrogen gas, and rinsing by the water doped with hydrogen gas are carried out. Thus, oxidation of the lower electrode 23 and upper electrode 25 is suppressed.

In addition, the rinsed wafer (substrate) is dried in a controlled atmosphere by suppressing the presence of oxygen to prevent metal oxidation.

More specifically, the sacrificial layer 9 is etched by the diluted solution of hydrogen fluoride with concentration of hydrogen in the solution of a few parts per million (ppm) to 10 ppm. The concentration of dissolved oxygen in the solution may be a few parts per billion (ppb) or lower. The water utilized for rinsing after etching is a hydrogen water prepared by doping hydrogen gas in pure water (DIW) with concentration of the dissolved oxygen of a few ppb. The concentration of the hydrogen gas dissolved in the solution is in the range of a few ppm to 10 ppm.

In addition, the etched wafer is dried in a nitrogen atmosphere with little or no oxygen, or in an atmosphere consisting of a nitrogen gas doped with hydrogen gas. For example, a so-called forming gas may be used, which is prepared by doping hydrogen gas in the nitrogen gas. As a result, oxidation of the lower electrode 23 and the upper electrode 25 is prevented. The hydrogen concentration in the nitrogen gas may be about 4% or less, which is the explosion limit of hydrogen gas.

For example, even when a diluted water solution of hydrogen fluoride and pure water with a concentration of dissolved oxygen of a few ppb or lower are used, oxidation may progress for the lower electrode 23 or the upper electrode 25 as shown in FIG. 3, and the gap 11 is clogged. On the other hand, by using the diluted water solution of hydrogen fluoride doped with hydrogen gas and pure water, it is possible to form the gap 11 without formation of the metal oxide 29.

FIG. 4 is a graph illustrating the current-voltage characteristics of the gap between metals according to this embodiment. The abscissa represents the voltage applied between the lower electrode 23 and the upper electrode 25, and the ordinate represents the current flowing between the lower electrode 23 and the upper electrode 25.

As shown in FIG. 4, the current between the lower electrode 23 and the upper electrode 25 has a background level of $10^{-13}$ A (measurement limit), and the two electrodes are insulated from each other. That is, it shows that the metal oxide 29 is not present between the lower electrode 23 and the upper electrode 25.

In addition, even when the organic layer 13 is formed in the gap 11, it is still preferred that oxidation of the lower electrode 23 and the upper electrode 25 be suppressed. That is, hydrogen gas is dissolved in the solvent having the organic molecules 15 dissolved in it.

A conventional example of the solvent where the organic molecules 15 are dispersed is tetrahydrofuran (THF). Because the THF can dissolve in water, for example, in the treatment for forming the organic layer 13, moisture in the atmosphere is mixed with the solvent to reach a concentration of a few hundred ppm to a few thousand ppm. Then, the oxygen dissolved in the mixed-in water corrodes (oxidizes) the lower electrode 23 and the upper electrode 25, and it may hamper the formation of the organic layer 13 in the gap 11.

Figure 5A:
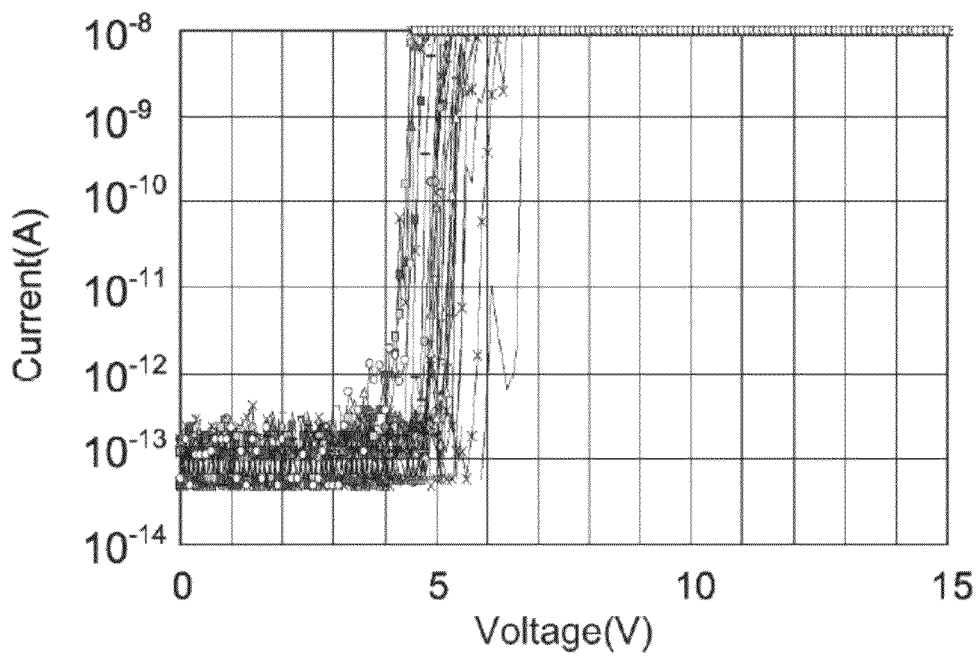
FIGS. 5A and 5B are graphs illustrating the current-voltage characteristics of the gap between metals according to the conventional example.

FIG. 5A is a graph illustrating the current-voltage characteristics between the lower electrode 23 and the upper electrode 25 dipped in the THF without the organic molecules 15 dispersed in it according to a conventional example. The abscissa represents the voltage, and the ordinate represents the current.

Because the organic molecules 15 are not dispersed, the organic layer 13 is not formed on the lower electrode 23. Consequently, the insulation characteristics are not displayed between the lower electrode 23 and the upper electrode 25. As shown in FIG. 5A, due to the application of a voltage of 4 to 6 V, short-circuit takes place between the two electrodes for the characteristics. This indicates that a current path is formed via the metal oxide between the lower electrode 23 and the upper electrode 25.

Figure 5B:
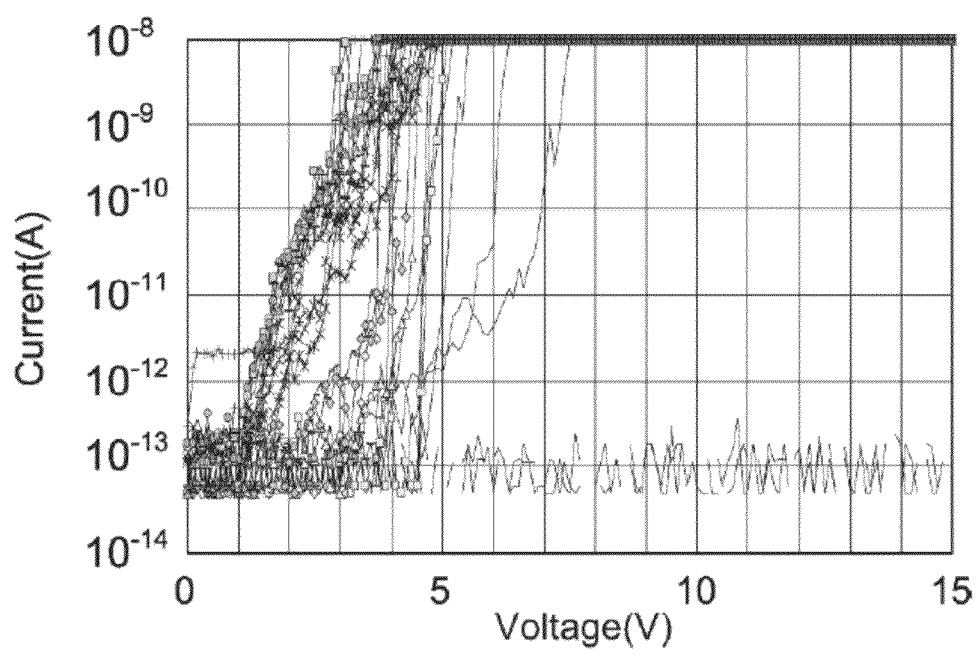

FIG. 5B is a graph illustrating the current-voltage characteristics between the lower electrode 23 and the upper electrode 25 dipped in the THF having the organic molecules 15 dispersed in it according to a conventional example. The abscissa represents the voltage, and the ordinate represents the current.

In the example shown in FIG. 5B, the characteristics wherein the current increases from near 1 V as the voltage increases and the characteristics of a short circuit between the two electrodes due to application of a voltage of 4 to 5 V are mixed with each other. That is, the portion formed by the organic layer 13 and the portion without formation of the organic layer 13 due to formation of the metal oxide are mixed with each other.

In this way, it is hard to form a uniform organic layer 13 in the gap 11 between the two electrodes simply by dipping the lower electrode 23 and the upper electrode 25 in the solvent where the organic molecules 15 are dispersed. As described herein, by doping the hydrogen gas in THF, it is possible to form a uniform organic layer 13 in the gap 11 between the two electrodes by suppressing oxidation of the lower electrode 23 and the upper electrode 25.

The solvent for dispersing the organic molecules 15 is not limited to THF. One may also use isopropyl alcohol (IPA), and other organic solvents. In this case, too, just as the THF, it is possible to dissolve the hydrogen gas in the organic solvents to suppress oxidation of the electrodes.

According to this embodiment, by doping (dissolving) hydrogen gas in the etching liquid, rinsing water and organic solvent for the sacrificial layer, it is possible to prevent clogging of the gap between the metals. As a result, it is possible to form a uniform organic layer 13 in the gap between metals.

Doping of hydrogen gas is not limited to the example wherein all of the steps of operation are executed. It may also be executed in at least one of the steps of operation. For example, when the organic layer 13 is formed by a CVD method, it may be executed in the etching process and the rinsing process that form the gap 11, or in the rinsing process alone.

Figure 7:
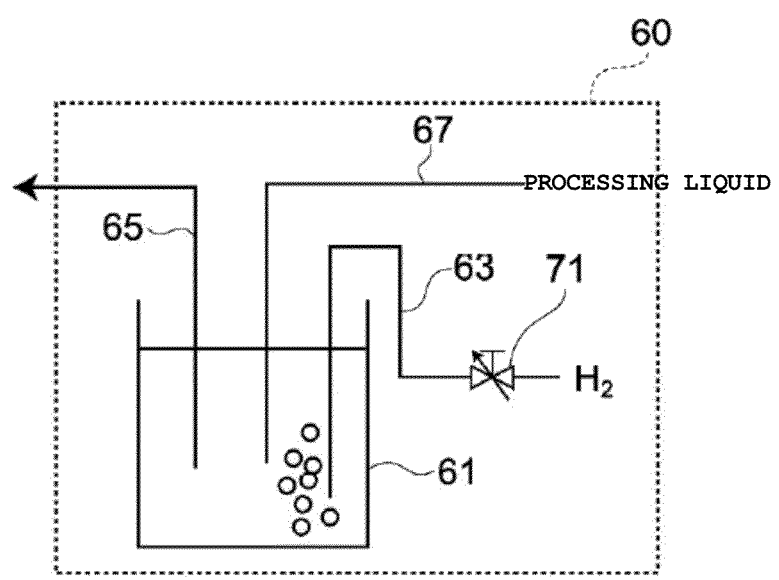
FIG. 7 is a schematic diagram illustrating the hydrogen gas doping apparatus according to the first embodiment.

In the following, with reference to FIG. 6 to FIG. 8, a manufacturing apparatus 50 for fabrication of the functional element 10 according to this embodiment will be explained. FIG. 6A and FIG. 6B are schematic cross-sectional views illustrating the manufacturing apparatus 50. FIG. 7 is a schematic diagram illustrating a bubbler 60. FIG. 8 is a flow chart illustrating the operation of the manufacturing apparatus 50.

As shown in FIG. 6A and FIG. 6B, the manufacturing apparatus 50 has a process chamber 32 having an inner chamber 31 that can be evacuated, and a gas port 35 for feeding the gas containing hydrogen into the inner chamber 31.

The inner chamber 31 has a wafer chuck 33 that supports the wafer 30, an outer frame 34 that fits the outer periphery of the wafer 30, a nozzle 37 for supplying the etching liquid and rinsing liquid to the surface of the wafer 30, and a nozzle 39 for supplying the organic solvent having organic molecules 15 dispersed in it.

In addition, flow rate controllers 41, 43 and 45 are arranged in the various pipelines that connect the gas port 35 and the nozzles 37 and 39, respectively. Here, the inner chamber 31 can be evacuated by an evacuating apparatus (not shown in the drawing) connected to the exhaust port 49. By supplying the gas containing hydrogen from the gas port 35, it is possible to maintain the atmosphere at a prescribed pressure.

FIG. 6A is a diagram illustrating the state in which the surface of the wafer 30 is immersed in the processing liquid 36. For example, the processing liquid 36 fed from the nozzle 37 is held in the reservoir formed as the wafer 30 and the outer frame 34 are engaged with each other.

FIG. 6B is a diagram illustrating the state in which the wafer chuck 33 is raised and the engagement between the wafer 30 and the outer frame 34 is released to drain the processing liquid. Then, the wafer 30 may be driven to rotate at a high speed by an external driving source for drying. In addition, the following scheme may also be adopted: the processing liquid is fed to the surface of the wafer 30, and treatment is carried out while the wafer 30 is driven to rotate at a low velocity.

The processing liquid fed via the nozzles 37 and 39 is doped with hydrogen gas by using, for example, the bubbler 60 shown in FIG. 7.

The bubbler 60 has a tank 61, a pipeline 67 for supplying the processing liquid to the tank 61, a pipeline 63 for supplying hydrogen gas via a valve 71 to tank 61, and a pipeline 65 for supplying the processing liquid doped with the hydrogen gas from the tank 61.

The interior of the tank 61 is filled up with the processing liquid fed via the pipeline 67, and the hydrogen gas is dissolved in the processing liquid by bubbling the hydrogen gas fed from the pipeline 63. On the other hand, the processing liquid doped with hydrogen gas is fed from a pump not shown in the figure via the pipeline 65 to the various nozzles. Here, the type of the bubbler 60 is one of various types corresponding to different types of the processing liquids, respectively.

As far as the method for doping the hydrogen gas is concerned, the method is not limited to the bubbling method. For example, it may also be carried out via a gas dissolving membrane. In addition, one may also adopt a method in which a degassing module using a hollow-yarn membrane is adopted together to remove the oxygen dissolved in the processing liquid.

In the following, the operation of the manufacturing apparatus 50 will be explained with reference to FIG. 8. As shown in the drawing, the wafer 30 is carried into the inner chamber 31 of the process chamber 32, and it is then secured on the wafer chuck 33 (S01).

Then, the interior of the inner chamber 31 is purged in a reductive atmosphere containing hydrogen gas (S02). For example, the inner chamber 31 is evacuated by a vacuum pump to a high vacuum state, and then the nitrogen gas doped with hydrogen (the forming gas) is fed. Then, while the forming gas is fed to flow at a prescribed flow rate, the pressure in the inner chamber 31 is kept on the prescribed level. In one embodiment, the concentration of hydrogen in the forming gas is lower than 4%, the explosion limit level of hydrogen.

Then, the sacrificial layer 9 formed on the surface of the wafer 30 is etched (S03). For example, as shown in FIG. 6A, the diluted solution of hydrogen fluoride doped with hydrogen gas is fed to the reservoir formed as the wafer 30 and the outer frame 34 are engaged with each other, so that the surface of the wafer 30 is dipped in it. Then, after a prescribed time, as shown in FIG. 6B, the wafer chuck 33 is raised so that the outer frame 34 and the wafer 30 are disengaged from each other, and the diluted solution of hydrogen fluoride is exhausted.

Then, the water doped with hydrogen gas is fed from the nozzle 37, and, for example, while the wafer 30 is driven to rotate at a low velocity, the surface of the wafer 30 is rinsed (S04). Then, wafer 30 may be driven to rotate at a high speed to remove the water doped with hydrogen gas and dried.

Then, the organic solvent is fed to the surface of the wafer 30 (S05: rinse 1). For example, THF without the organic molecules 15 dispersed in it is fed from the nozzle 39 to wet the surface of the wafer. Then, the wafer 30 and the outer frame 34 are engaged with each other, and the surface of the wafer 30 is immersed in the THF having the organic molecules 15 dispersed in it (S06). Then, after holding for a prescribed time, the organic layer 13 is formed on the surface of the lower electrode 3.

Then, the outer frame 34 and the wafer 30 are disengaged from each other, and the THF having the organic molecules 15 dispersed in it is exhausted. Then, the THF or IPA without the organic molecules 15 dispersed in it is fed to the surface of the wafer 30 (S07: rinse 2). In addition, the wafer 30 may be driven to rotate at a high speed to dry its surface.

As a result, the organic layer 13 is formed in the gap 11 between the lower electrode 3 and the upper electrode 5, and a functional element 10 can be formed. While not shown, the manufacturing apparatus 50 has a controller that stores the sequence or a program for executing the sequence.

In the sequence, the process of steps of operation 02 to 07 may be executed continuously in an atmosphere containing hydrogen. In the process 05 of rinse 1 and the process 06 of formation of the organic layer 13, THF doped with hydrogen gas it is provided.

In the manufacturing operation, explanation has been made with an example in which the wafer 30 is dipped (immersed) in a processing liquid. However, the present disclosure is not limited to the example. Alternatively, one may also adopt a method in which spaying is carried out on the wafer 30 from the nozzles 37 and 39 to carry out the SAM formation, rinsing, and wet etching of the sacrificial layer.

In addition, the operation may be carried out using the same chamber or using multiple chambers, respectively. For example, the operation of etching of the sacrificial layer 9 in the processes 03 and 04 and the operation of formation of the organic layer 13 in processes 05 to 07 may be carried out in different chambers. Here, it is preferred that transfer of the wafer 30 between chambers be carried out in an atmosphere containing hydrogen.

As explained above, according to the present embodiment, by carrying out the operation of etching of the sacrificial layer 9 by the diluted solution of hydrogen fluoride doped with hydrogen gas and the operation of rinsing by water doped with hydrogen gas, it is possible to suppress oxidation of the lower electrode 23 and the upper electrode 25. In addition, in drying of the rinsed wafer, as the operation is provided in a controlled atmosphere with suppressed content of oxygen, it is possible to prevent oxidation of metal. As a result, it is possible to form the gap 11 without including the metal oxide 29 between the lower electrode 23 and the upper electrode 25.

Second Embodiment

Figure 9A:
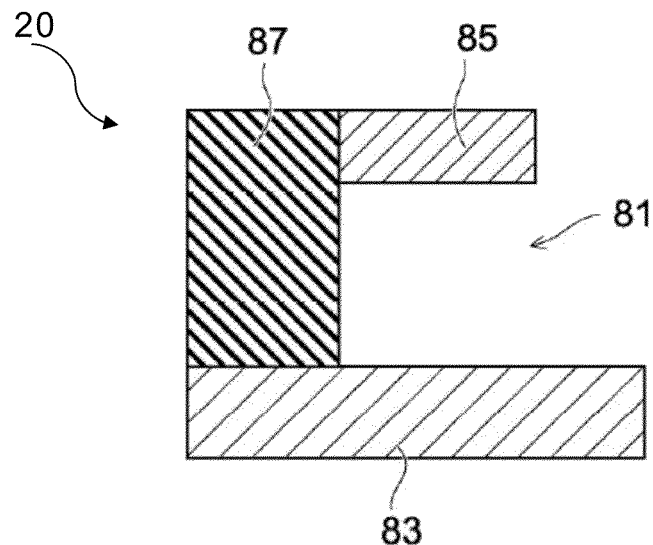
FIGS. 9A to 9C are schematic diagrams illustrating a manufacturing process of a functional element according to a second embodiment.
Figure 9B:
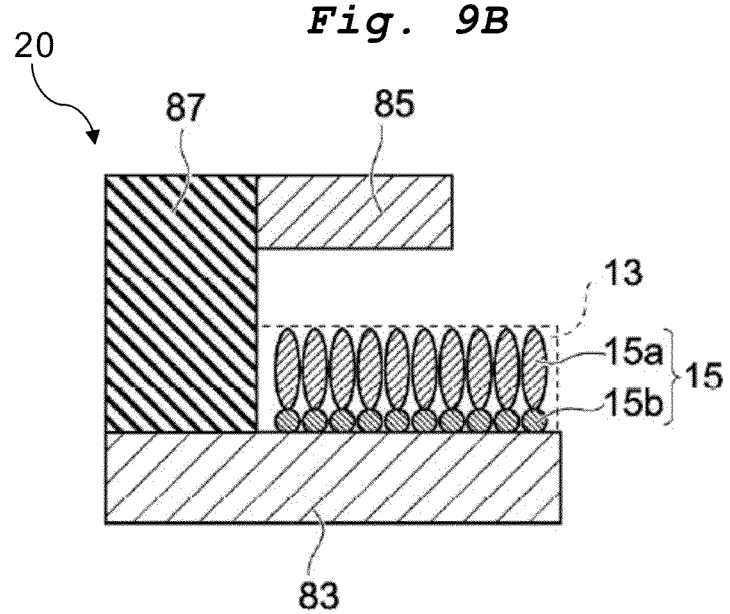
Figure 9C:
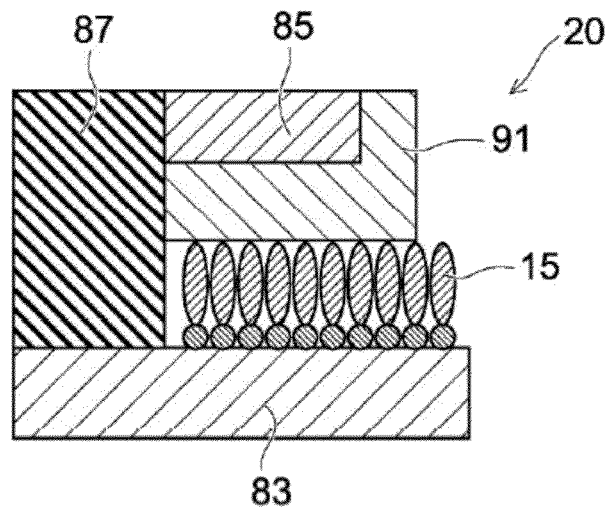

FIG. 9A to FIG. 9C are schematic diagrams illustrating the manufacturing process of a functional element 20 according to the second embodiment. In this embodiment, a gap 81 between a lower electrode 83 (the first electrode) and an upper electrode 85 (the second electrode) shown in FIG. 9A is formed longer than that of the gap 11 between the lower electrode 3 and the upper electrode 5 shown in FIG. 2B.

Figure 12A:
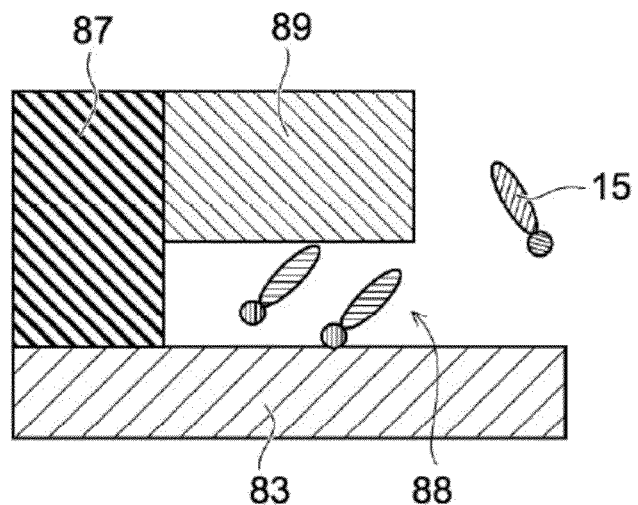
FIGS. 12A and 12B are schematic diagrams illustrating the manufacturing process of the functional element according to a conventional example.
Figure 12B:
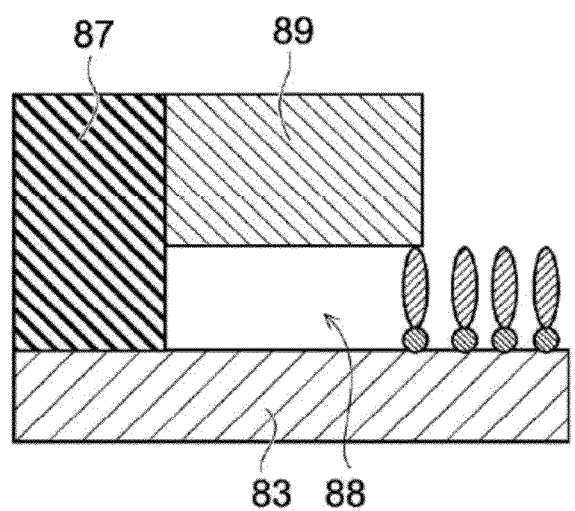

For example, for the functional element shown in FIG. 12A and FIG. 12B, a gap 88 between the lower electrode 83 and the upper electrode 89 is equal to or similar to the length of the organic molecules 15.

In this way, as the gap between metals is as fine as that matching the length of the organic molecules, in the nano-space of the gap, the liquid or gas does not behave as a fluid. Consequently, as shown in FIG. 12A, the organic molecules 15 may not be distributed well. Also, as shown in FIG. 12B, in the opening of the gap 88, the organic molecules 15 are bonded with the lower electrode 83, and the organic molecules 15 cannot be distributed into the deep portion of the gap 88. Either way, the organic layer 13 cannot be formed inside the gap 88.

Here, the gap 81 between the lower electrode 83 and the upper electrode 85 shown in FIG. 9A is formed, for example, at a dimension that is twice or more the molecular length of the organic molecules 15. As a result, the organic molecules 15 can be easily fed into the depth of the gap 81. As shown in FIG. 9B, it is possible to form a uniform organic layer 13 inside the gap 81.

In addition, as shown in FIG. 9C, the upper electrode 85 is oxidized, and an electroconductive metal oxide layer 91 between the organic layer 13 and the upper electrode 85 is formed. That is, the thickness of the upper electrode 85 is increased by a portion corresponding to the thickness of the metal oxide layer 91, and the space between the organic layer 13 and the upper electrode 85 is decreased. As a result, the current flowing between the lower electrode 83 and the upper electrode 85 via the organic layer 13 can be increased. That is, the switching current when the organic layer 13 is changed from the high-resistance state to the low-resistance state increases, so that it is possible to increase the signal current when the memory information is read.

Figure 10A:
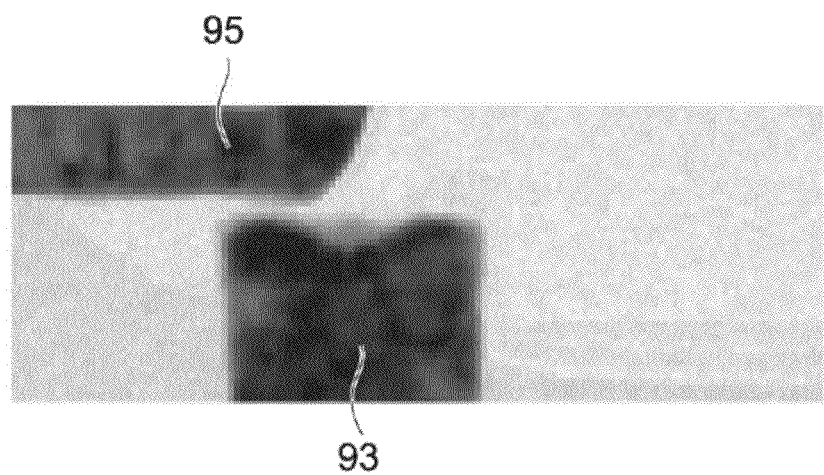
FIGS. 10A and 10B show the TEM image of the gap between metals according to the second embodiment.

FIG. 10A shows the TEM image of the gap between metals according to the second embodiment. The lower electrode 93 is made of tungsten, and the upper electrode 95 is made of molybdenum. The two electrodes are set facing each other via an air gap. The gap is about 5 nm.

Figure 10B:
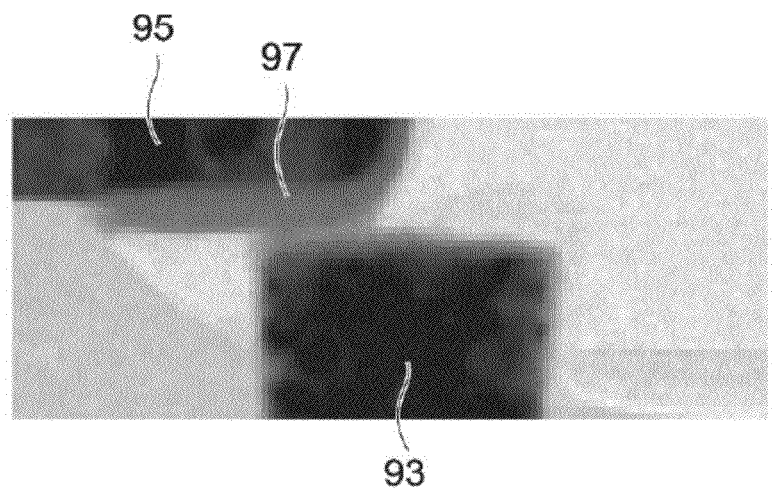

FIG. 10B is a diagram illustrating the state in which a metal oxide layer 97 is formed between the lower electrode 93 and the upper electrode 95. Here, the metal oxide layer 97 decrease the gap between the two electrodes.

The metal oxide layer 97 is an electroconductive oxide of molybdenum. Consequently, as the metal oxide layer 97 is formed, the upper electrode 95 is substantially thicker, so that the gap becomes narrower. As a result, by oxidation of the upper electrode 95, it is possible to decrease the gap between the upper electrode 95 and the organic molecules 15.

In addition to molybdenum (Mo), the oxides of nickel (Ni), ruthenium (Ru), rhenium (Re), europium (Eu), etc. are also electroconductive, and they can also be adopted in forming the upper electrode 95. Also, there are a lot of electroconductive ternary metal oxides, and they may also be adopted as the upper electrode 95.

For example, the upper electrode 95 can be exposed to ozone gas for oxidation. In addition, it may also be exposed to water having oxygen gas dissolved in it or to a solvent containing the water having the oxygen gas dissolved in it.

The scheme for increasing the thickness of the upper electrode 95 is not limited to oxidation. For example, electroless plating may be carried out on the upper electrode 95 by using nickel (Ni), copper (Cu), palladium (Pd), platinum (Pt), or other metal. In addition, one may also adopt a scheme in which the metal materials are coated on the surface of the upper electrode 95.

FIG. 11 includes graphs illustrating the current-voltage characteristics of the functional element according to the second embodiment. Here, it shows the results of measurement of the current flowing via the triphenyl thiol (TPT) bonded on the (111) surface of gold (Au) on a scanning probe electronic microscope (SPM).

Figure 11A:
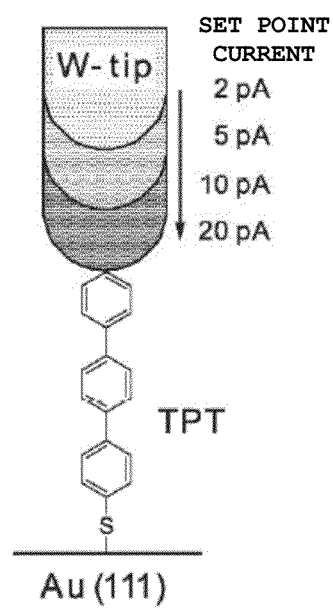
FIGS. 11A and 11B are schematic cross-sectional views illustrating the characteristics of the functional element according to the second embodiment.

As shown in FIG. 11A, as the gap between the upper terminal of the organic molecule TPT and the tip of the tungsten probe is decreased, the current under a prescribed voltage (set point) increases.

Figure 11B:
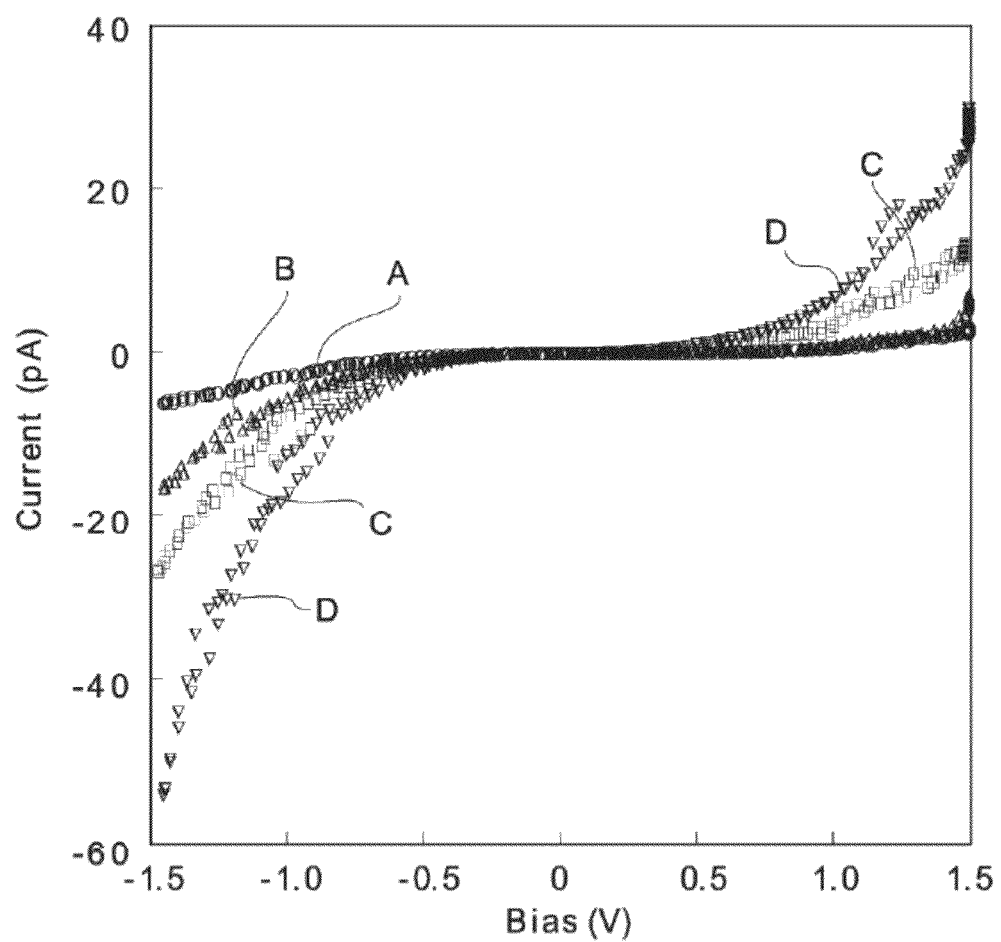

FIG. 11B is a graph illustrating the voltage dependence of the current flowing via the TPT. The ordinate represents the current, and the abscissa represents the bias voltage.

As shown in the drawing, graph A shows the current-voltage characteristics in the gap spacing when the set point current is 2 pA. On the other hand, graph B shows the case when the set point current is 5 pA, graph C shows the case when the set point current is 10 pA, and graph D shows the case when the set point current is 20 pA.

It can be seen that the current flowing via the organic molecules varies depending on the gap between the electrode and the organic molecules. As the gap between the electrode and the organic molecules is decreased, the signal current flowing between the electrodes via the organic molecules increases.

As explained above, according to the present embodiment, by arranging the organic molecules 15 in a gap larger than the molecular length of the organic molecules, it is possible to form a uniform self-assembled mono-molecular layer (SAM) on the lower electrode 83. Here, as a metal oxide layer formed by oxidation of the upper electrode 85 is included in the gap, it is possible to decrease the gap between the organic molecules and the electrode, so that it is possible to increase the signal current.

In addition, according to the present embodiment, the upper electrode 85 is oxidized, and the electroconductive metal oxide layer 91 is formed between the organic layer 13 and the upper electrode 85. That is, the thickness of the upper electrode 85 is increased by what corresponds to the thickness of the metal oxide layer 91, and the space between the organic layer 13 and the upper electrode 85 is decreased. As a result, the current flowing between the lower electrode 83 and the upper electrode 85 via the organic layer 13 can be increased. That is, the switching current when the organic layer 13 is changed from the high-resistance state to the low-resistance state is increased, so that the signal current when the memory information is read can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method for a functional element, comprising:
   forming a first electrode and a second electrode facing the first electrode;
   filling a gap between the first electrode and the second electrode with a solvent including hydrogen gas and organic molecules dispersed therein; and
   forming an organic layer containing the organic molecules between the first electrode and the second electrode.

2. The method of claim 1, wherein the organic layer is a self-assembled mono-molecular layer formed on the surface of the first electrode.

3. The method of claim 2, wherein the self-assembled mono-molecular layer has a resistance-varying type molecular chain with a reaction group at one end of the molecular chain.

4. The method of claim 3, wherein the reaction group is a thiol group, and the first electrode contains tungsten.

5. The method of claim 2, further comprising:
   forming an electroconductive layer between the organic layer and the second electrode.

6. The method of claim 5, wherein the electroconductive layer is a metal oxide layer formed by oxidation of the second electrode.

7. The method of claim 1, wherein the gap is formed by etching a sacrificial layer formed between the first electrode and the second electrode, the etching provided by an etching liquid doped with hydrogen gas.

8. The method of claim 1, further comprising:
   rinsing the gap between the first electrode and the second electrode with water doped with hydrogen gas.

9. The method of claim 8, wherein rinsing the gap and forming the organic layer are provided in a reducing atmosphere containing hydrogen gas.

10. A manufacturing method for a functional element, comprising:
    forming a first electrode and a second electrode facing the first electrode;
    filling a gap between the first electrode and the second electrode with a solvent including hydrogen gas and organic molecules dispersed therein;
    rinsing the gap between the first electrode and the second electrode with water doped with hydrogen gas; and
    forming an organic layer containing the organic molecules between the first electrode and the second electrode.

11. The method of claim 10, wherein rinsing the gap and forming the organic layer are provided in a reducing atmosphere containing hydrogen gas.

12. A manufacturing method for a functional element, comprising:
    forming a first electrode and a second electrode facing the first electrode;
    applying a solvent including hydrogen gas and organic molecules dispersed therein to a surface of the first electrode and the second electrode; and
    forming an organic layer containing the organic molecules between the first electrode and the second electrode after applying the solvent, wherein the organic layer contacts the surface of the first electrode without contacting the surface of the second electrode.

13. The method of claim 12, wherein the solvent is applied to a gap that is formed by etching a sacrificial layer formed between the first electrode and the second electrode, the etching provided by an etching liquid doped with hydrogen gas.

14. The method of claim 13, further comprising:
    rinsing the gap between the first electrode and the second electrode with water doped with hydrogen gas.

15. The method of claim 14, wherein rinsing the gap and forming the organic layer are provided in a reducing atmosphere containing hydrogen gas.

* * * * *